United States Patent
Bertness

[19]

[11] Patent Number: 6,051,976
[45] Date of Patent: *Apr. 18, 2000

[54] METHOD AND APPARATUS FOR AUDITING A BATTERY TEST

[75] Inventor: Kevin I. Bertness, Batavia, Ill.

[73] Assignee: Midtronics, Inc., Burr Ridge, Ill.

[ * ] Notice: This patent issued on a continued prosecution application filed under 37 CFR 1.53(d), and is subject to the twenty year patent term provisions of 35 U.S.C. 154(a)(2).

[21] Appl. No.: 08/681,730

[22] Filed: Jul. 29, 1996

[51] Int. Cl.⁷ .................................................. G01R 27/26
[52] U.S. Cl. ........................................... 324/426; 340/636
[58] Field of Search ................................... 324/426, 427, 324/429, 433; 340/636

[56] References Cited

U.S. PATENT DOCUMENTS

| | | |
|---|---|---|
| 3,873,911 | 3/1975 | Champlin .............................. 324/29.5 |
| 3,909,708 | 9/1975 | Champlin .............................. 324/29.5 |
| 4,423,378 | 12/1983 | Marino et al. ......................... 324/427 |
| 4,514,694 | 4/1985 | Finger .................................... 324/429 |
| 4,816,768 | 3/1989 | Champlin .............................. 324/428 |
| 4,820,966 | 4/1989 | Fridman ................................ 324/434 |
| 4,825,170 | 4/1989 | Champlin .............................. 324/436 |
| 4,881,038 | 11/1989 | Champlin ............................. 324/426 |
| 4,912,416 | 3/1990 | Champlin .............................. 324/430 |
| 5,032,825 | 7/1991 | Kuznicki ........................... 340/825.44 |
| 5,140,269 | 8/1992 | Champlin .............................. 324/433 |
| 5,144,248 | 9/1992 | Alexandres et al. .................. 324/428 |
| 5,426,371 | 6/1995 | Salley et al. ........................... 324/429 |
| 5,528,148 | 6/1996 | Rogers .................................. 324/426 |
| 5,606,242 | 2/1997 | Hull et al. ............................. 324/426 |

*Primary Examiner*—Maura Regan
*Attorney, Agent, or Firm*—Westman, Champlin & Kelly, P.A.

[57] ABSTRACT

A method and apparatus for auditing condition of a storage battery performs a battery test on the storage battery to obtain a test result. Test condition information is obtained related to conditions of the battery test. The battery test result and the test condition information is combined into a code. The code may be subsequently used to determine conditions during the battery test which lead to the particular test result.

54 Claims, 2 Drawing Sheets

METHOD AND APPARATUS FOR AUDITING A BATTERY TEST

BACKGROUND OF THE INVENTION

The present invention relates to testing storage batteries. More specifically, the present invention relates to generating a code related to a battery test.

Storage batteries, such as lead acid storage batteries of the type used in the automotive industry, have existed for many years. However, understanding the nature of such storage batteries, how such storage batteries operate and how to accurately test such batteries has been an ongoing endeavor and has proved quite difficult. Storage batteries consist of a plurality of individual storage cells electrically connected in series. Typically each cell has a voltage potential of about 2.1 volts. By connecting the cells in series, the voltages of the individual cells are added in a cumulative manner. For example, in a typical automotive storage battery, six storage cells are used to provide a total voltage when the battery is fully charged of 12.6 volts.

There has been a long history of attempts to accurately test the condition of storage batteries. A simple test is to measure the voltage of the battery. If the voltage is below a certain threshold, the battery is determined to be bad. However, this test is inconvenient because it requires the battery to be charged prior to performing the test. If the battery is discharged, the voltage will be low and a good battery may be incorrectly tested as bad. Furthermore, such a test does not give any indication of how much energy is stored in the battery. Another technique for testing a battery is referred as a load test. In a load test, the battery is discharged using a known load. As the battery is discharged, the voltage across the battery is monitored and used to determine the condition of the battery. This technique requires that the battery be sufficiently charged in order that it can supply current to the load.

More recently, a technique has been pioneered by Dr. Keith S. Champlin for testing storage batteries by measuring the conductance of the batteries. This technique is described in a number of United States patents obtained by Dr. Champlin, for example, U.S. Pat. No. 3,873,911, issued Mar. 25, 1975, to Champlin, entitled ELECTRONIC BATTERY TESTING DEVICE; U.S. Pat. No. 3,909,708, issued Sep. 30, 1975, to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; and U.S. Pat. No. 5,140,269, issued Aug. 18, 1992, to Champlin, entitled ELECTRONIC TESTER FOR ASSESSING BATTERY/CELL CAPACITY.

As battery test results have become more accurate, and the repeatability of those results has increased, we have recognized a new problem. Specifically, if a subsequent battery test is performed at a later time and perhaps at a different location and under different conditions, there is no adequate way to compare the results of the two tests. It is impossible to determine if differences in test results are due to improper use of the test equipment, inaccurately recorded test results or even falsification of the test results. For example, this problem can be particularly vexing to battery manufactures, battery distributors, and automobile companies who offer warranties with their batteries. Further, the precise conditions of the test and test results would be useful in determining the cause of the failure and reducing the likelihood of failure in new batteries by identifying and correcting defects.

SUMMARY OF THE INVENTION

The present invention offers solutions to problems associated with the aforementioned problems. The present invention provides a method and apparatus for auditing a battery test. In the method, a battery test is performed on a storage battery to obtain a test result. Test condition information is obtained regarding conditions related to the battery test. The test result and the test condition information is combined into a code and the code is stored or output for future reference.

Similarly, the apparatus includes battery test circuitry for performing a battery test on the storage battery and providing a test result. Input circuitry receives test condition information which is related to conditions of the battery test. Calculation circuitry coupled to the battery test circuitry and the input circuitry combines the battery test result and the test condition information and responsively provides a code output.

In various embodiments of the invention, the code output can be used to subsequently analyze the battery test in view of the test conditions.

DETAILED DESCRIPTION OF THE PREFERRED EMBODIMENTS

The present invention provides a new and useful technique for monitoring and auditing a battery test of a storage battery, such as a lead acid storage battery. The present invention is for use with any battery tester or testing technique and those discussed herein are strictly as examples. The present invention provides a method and apparatus for combining the result of a battery test with information related to conditions of the battery test into a code which can be subsequently accessed. As described herein, the present invention is useful in subsequent analysis of batteries which failed the battery test and may be used to monitor batteries returned on warranty, to monitor operator performance and can be used in detecting and identifying a faulty design of a storage battery.

Figure 1:
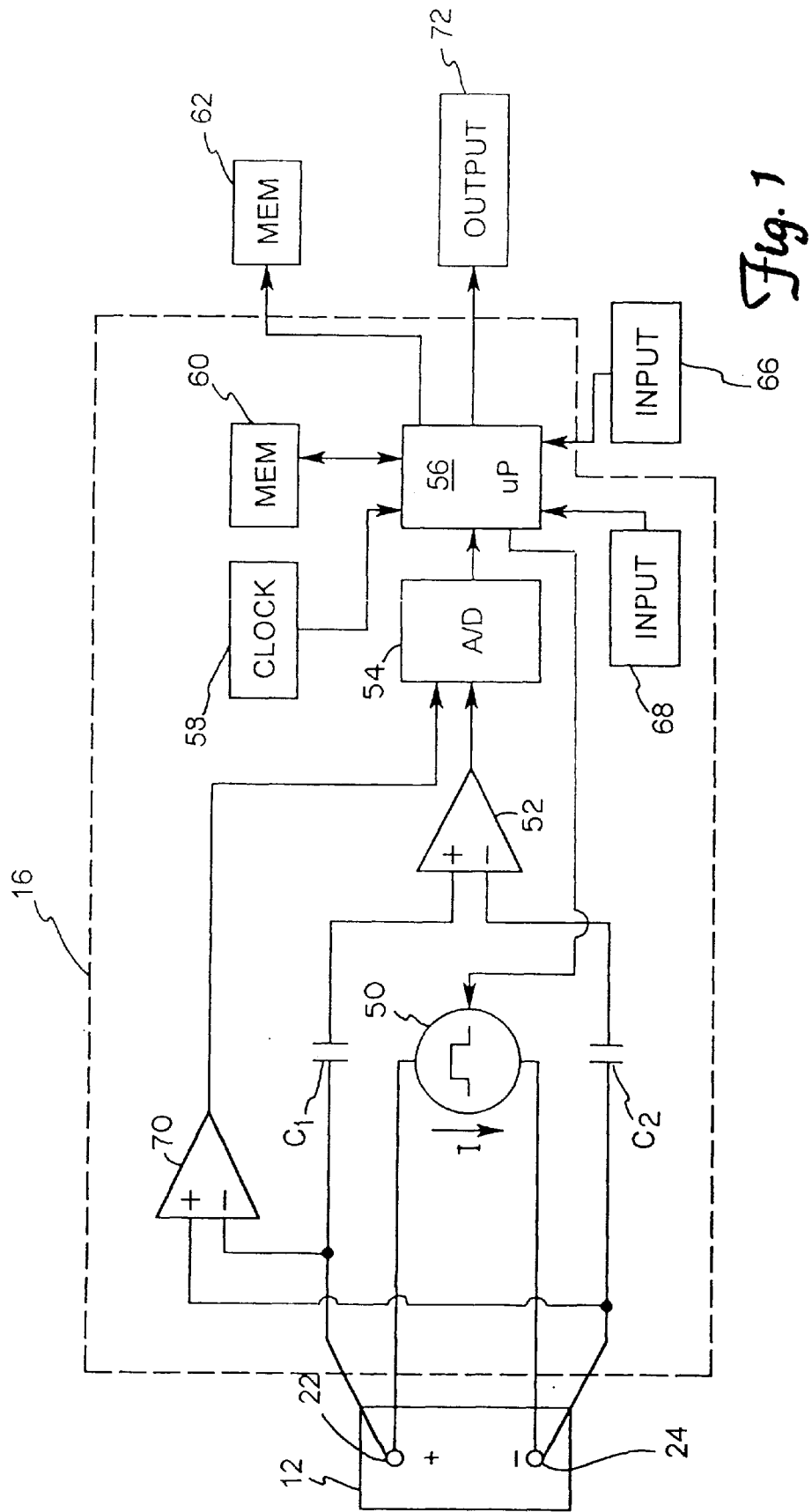
FIG. 1 is a simplified schematic diagram showing battery monitoring and auditing circuitry in accordance with the present invention.

FIG. 1 is a simplified block diagram of battery monitoring circuitry 16 in accordance with the present invention. Apparatus 16 is shown coupled to battery 12 which includes a positive battery terminal 22 and a negative battery terminal 24.

Circuitry 16 operates in accordance with one embodiment of the present invention and determines the conductance ($G_{BAT}$) of battery 12 and the voltage potential ($V_{BAT}$) between terminals 22 and 24 of battery 12. Circuitry 16 includes current source 50, differential amplifier 52, analogto-digital converter 54 and microprocessor 56. Amplifier 52 is capacitively coupled to battery 12 through capacitors $C_1$ and $C_2$. Amplifier 52 has an output connected to an input of analog-to-digital converter 54. Microprocessor 56 is connected to system clock 58, memory 60, memory 62 and analog-to-digital converter 54. Microprocessor 56 is also capable of receiving an input from input devices 66 and 68. Microprocessor 56 also connects to output device 72.

In operation, current source 50 is controlled by microprocessor 56 and provides a current I in the direction shown by the arrow in FIG. 1. In one embodiment, this is a square wave or a pulse. Differential amplifier 52 is connected to terminals 22 and 24 of battery 12 through capacitors $C_1$ and $C_2$, respectively, and provides an output related to the voltage potential difference between terminals 22 and 24. In a preferred embodiment, amplifier 52 has a high input impedance. Circuitry 16 includes differential amplifier 70 having inverting and noninverting inputs connected to terminals 24 and 22, respectively. Amplifier 70 is connected to measure the open circuit potential voltage ($V_{BAT}$) of battery 12 between terminals 22 and 24. The output of amplifier 70 is provided to analog-to-digital converter 54 such that the voltage across terminals 22 and 24 can be measured by microprocessor 56.

Circuitry 16 is connected to battery 12 through a four-point connection technique known as a Kelvin connection. This Kelvin connection allows current I to be injected into battery 12 through a first pair of terminals while the voltage V across the terminals 22 and 24 is measured by a second pair of connections. Because very little current flows through amplifier 52, the voltage drop across the inputs to amplifier 52 is substantially identical to the voltage drop across terminals 22 and 24 of battery 12. The output of differential amplifier 52 is converted to a digital format and is provided to microprocessor 56. Microprocessor 56 operates at a frequency determined by system clock 58 and in accordance with programming instructions stored in memory 60.

Microprocessor 56 determines the conductance of battery 12 by applying a current pulse I using current source 50. The microprocessor determines the change in battery voltage due to the current pulse I using amplifier 52 and analog-to-digital converter 54. The value of current I generated by current source 50 is known and is stored in memory 60. In one embodiment, current I is obtained by applying a load to battery 12. Microprocessor 56 calculates the conductance of battery 12 using the following equation:

$$\text{Conductance} = G_{BAT} = \frac{\Delta I}{\Delta V} \qquad \text{Equation 1}$$

where $\Delta I$ is the change in current flowing through battery 12 due to current source 50 and $\Delta V$ is the change in battery voltage due to applied current $\Delta I$.

Based upon the battery conductance $G_{BAT}$ and the battery voltage, the battery tester 16 determines the condition of battery 12. For example, if the battery conductance $G_{BAT}$ is lower than a predetermined threshold for a particular battery at a particular voltage, microprocessor 56 determines that battery 12 has failed the battery test. For example, as explained in the Champlin patents, the tester can compare the measured CCA (Cold Cranking Amp) with the rated CCA for that particular battery. Microprocessor 56 uses information input from input device 66 provided by, for example, an operator. This information may consist of the particular type of battery, location, time, the name of the operator etc. Additional information relating to the conditions of the battery test is received by microprocessor 56 from input device 68. Input device 68 may comprise one or more sensors, for example, or other elements which provide information such as ambient or battery temperature, time, date, humidity, barometric pressure, noise amplitude or characteristics of noise in the battery or in the test result, or any other information or data which may be sensed or otherwise recovered which relates to the conditions of the test, how the battery test was performed, or intermediate results obtained in conducting the test. Additional test condition information is provided by microprocessor 56. Such additional test condition information may include the values of $G_{BAT}$ and battery voltage, the various inputs provided to battery tester 16 by the operator which may include, for example, type of battery, estimated ambient or battery temperature, type of vehicle (i.e., such as provided through the Vehicle Identification Number (VIN) code for the vehicle) or the particular sequence of steps taken by the operator in conducting the test. In accordance with the present invention, microprocessor 56 uses some, or all, of the various battery test condition information and combines such test condition information with the test result to generate a code. This code is provided to output device 72 which may comprise, for example, a display or a printer. In another embodiment, the code is stored in memory 62 for subsequent use. As used herein, input circuitry refers to any circuitry used to obtain the test condition information and may include inputs 66 and 68, memory 60, etc.

The code of the present invention may be generated through any appropriate technique. Two examples follow.
For example, the display 72 will indicate:
"TEST CODE: A0XXXX1YYYY2222Z".
Where the information is encoded as follows:
A: Alphanumeric code representing geographic territory
0: 0=no temperature compensation used in conditioning the test. 1=temperature compensation used in conditioning the test.
XXXX: Entered battery rating in coded CCA (Cold Cranking Amps) (0=A, 1=B, 2=C, etc.) I.E. "0625 CCA" displayed as AGCF
1: Result of battery test:
  0=Good—Return to Service
  1=Good—Recharge & Return to Service
  2=Recharge & Retest
  3=Bad battery
  4=Bad cell battery
YYYY: Measured coded battery voltage without decimal point (0=A, 1=B, etc.) I.E. "12.65 Volts" displayed as BCGF
2222: Actual CCA measured by tester.
Z: Alphanumeric code representing state of charge.

An example using eight characters follows. A pseudo base 26 number, represented by two alpha characters, is used to represent certain values in this test code.

For example, to convert the coded number "CZ", look up the alpha characters in the following table:

| A = 0  | B = 1  | C = 2  | D = 3  | E = 4  | F = 45 |
|--------|--------|--------|--------|--------|--------|
| G = 6  | H = 7  | I = 8  | J = 9  | K = 10 | L = 11 |
| M = 12 | N = 13 | O = 14 | P = 15 | Q = 16 | R = 17 |
| S = 18 | T = 19 | U = 20 | V = 21 | W = 22 | X = 23 |
| Y = 24 | Z = 25 |        |        |        |        |

Take the first letter, "C", and multiply its value by 26. Then add the value of the second letter "Z": {"C"×26}+"Z".

$(2) \times (26) = 52.$   Equation 2

$52 + 25 = 77.$   Equation 3

The coded number is 77.

The display 72 will indicate "TEST CODE: XX0YY1ZZ", for example.

The information is encoded as follows:

XX: Entered coded battery rating in 5 CCA increments. For example, 360 CCA would be represented as 72, 650 CCA as 130, etc. CCA will be rounded to the nearest 5 CCA value. The coded CCA is then represented using the Pseudo Base 26 scheme listed above. 360 CCA=72 coded=CU. 650 CCA=130=FA.

0: Result code:
- 0=Good—Return to Service
- 1=Good—Recharge & Return to Service
- 2=Recharge & Retest
- 3=Bad battery
- 4=Bad cell battery
- 5=Good—Return to Service (temperature compensated during test)
- 6=Good—Recharge & Return to Service (temperature compensated during test)
- 7=Recharge & Retest (temperature compensated during test)
- 8=Bad battery (temperature compensated)
- 9=Bad cell battery (temperature compensated)

YY: Measured coded voltage in 50 mVolt increments. For example, 10.00 volts would be represented as 200, 12.75 volts as 255, etc. Voltage will be rounded to the nearest 50 mVolt value. The coded voltage is then represented using the Pseudo Base 26 scheme listed above. 10.00 volts=200 coded=HS. 12.75 volts=255=JV.

1: Numeric code representing state of charge. The state of charge of the battery is indicated by a single numeric character. "0" represents that SOC is not applicable, such as in Replace Battery or Recharge and Retest. "5" represents 100% state of charge. "1"–"4" are divided in equal steps between a selected lower percentage and 100% relative conductance.

ZZ: Actual measured battery cranking power in 5 CCA increments. For example, 360 CCA would be represented as 72, 650 CCA as 130, etc. CCA will be rounded to the nearest 5 CCA value. The coded CCA is then represented using the Pseudo Base 26 scheme listed above. 360 CCA=72 coded=CU. 650 CCA=130=FA.

Figure 2:
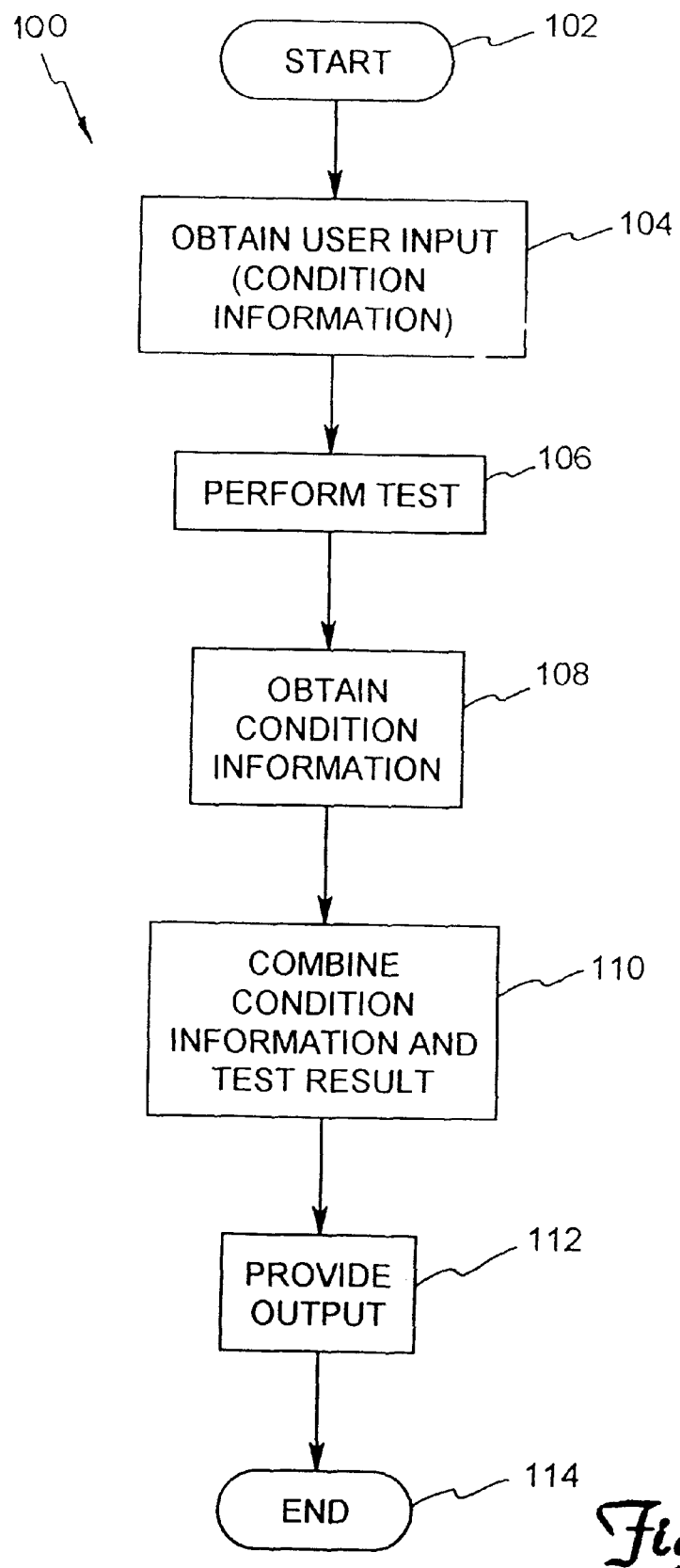
FIG. 2 is a simplified block diagram shown the steps of a method in accordance with the invention.

FIG. 2 is a simplified block diagram showing steps in accordance with the method of the present invention. FIG. 2 shows flow chart 100 which initiates operation at start block (or step) 102. At block 104, user input is obtained. For example, user input is obtained through input device 66 and may constitute instructions for performing a battery test, the rated cold cranking amps (CCA) for the batter under test, estimated temperature during the test for temperature compensation during the test or any other user input related to the test or test environment. This information is provided to microprocessor 56 and is stored in memory 60 for use during the test. Additional information may relate to a particular vehicle in which the battery in installed which may be obtained, for example, using the VIN code for the vehicle. Further, the make, model and manufacturer of the battery 12 may be provided. Other such information includes battery specific information, such as a serial number, digital signature for tracking and identifying the battery, make, model, and date of manufacture of the battery, etc. Such information may be manually input or, for example, read from a bar code carried on the battery.

At block 106, microprocessor 56 performs the battery test using the techniques described above. However, it will be understood that those techniques are merely examples and the battery test may be any battery test including a simple voltage measurement test, a load test, resistance, conductance, impedance, admittance, or other parameter test, battery capacity or state of charge test, digital hygrometer test in which the specific gravity of the battery acid is measured, complex charging and discharging tests which are known in the art, etc. It will be understood that in various embodiments of the present invention, the particular test may be selected from any available or yet to be discovered battery test.

At block 108, microprocessor 56 obtains any additional condition information which may be used in accordance with the invention. As explained above, the information may be any information related to the test such as actual ambient or battery temperature sensed by device 68, various intermediate test results which were obtained in performing the test at step 106, various battery parameters such as surface charge, voltage, conductance, resistance, float current, noise amplitude, noise frequency or other noise characteristics, etc. At step 110, microprocessor 56 combines the condition information obtained at step 108 with the test results obtained at step 106 into a string of information. The information may be of any form and is not limited to the character code described above. The information may be digitally encoded into a series of data bytes. However, in one preferred embodiment, an alpha numeric code is preferred. This combination of information is referred to herein as a code. At block 112, this code is output using an appropriate technique. For example, the code can be output on output device 72 which may be a display, printer, label printer, bar code printer, modem or other data transmission means, etc. In another variation on the invention, the step 112 provides the output to memory 62 for subsequent use. For example, a plurality of codes may be collected in memory for subsequent output or analysis. At block 114, the procedure ends.

One advantage of the present invention is that it is particularly useful in ensuring compliance with the warranty return policies of manufacturers. For example, if, upon identifying a faulty battery, the operator marks the battery 12 with the code provided on output device 72, for example, by marking directly on the battery or applying a sticker to the battery when the battery is returned, the manufacturer will have information regarding the test which resulted in the return of the battery. In one preferred embodiment, the code is encrypted or otherwise difficult to duplicate whereby the code cannot be falsified. Thus, the manufacturer may then perform a subsequent test on the battery and compare the subsequent test result with the result obtained which lead to the warranty return. This will make it very difficult for the unscrupulous individual to return a battery under a warranty policy where the battery is not faulty. Furthermore, the invention provides additional traceability of the batteries which are being returned to the manufacturer in that the particular code may contain geographic and location information used to identify the particular test location and operator which lead to the failed test. Further still, if the battery is in a new car and is being returned to the automobile manufacturer, the manufacturer can retrieve information regarding the vehicle such as through the VIN code of the vehicle.

The present invention provides a convenient technique for a manufacturer to collect information regarding batteries which fail battery tests. Such information can be used in improving future batteries or identifying faults in existing batteries. For example, the code can contain information regarding the various intermediate steps or measurements which are obtained in providing the battery test. This could be, for example, battery recovery voltage, voltage after a first test, voltage after a second test, surface charge voltage, voltage or current in response to an applied load or signal, temperature compensation input, noise amplitude or other noise characteristics, float current, etc.

The present invention may be used with standby batteries such as those used to power remote telephone switching locations, computer facilities, power company facilities, pumping stations, etc. It will be understood by those skilled in the art that the present invention is not limited to automotive storage batteries.

In one embodiment of the invention, the code is in an encrypted format to thereby reduce the likelihood of code falsification. In the two examples described above, the code is encrypted in that it is difficult for a user who is unfamiliar with the particular coding technique to discover the precise technique being used and generate valid codes which contain falsified information. A further embodiment of the invention includes providing a stronger encryption algorithm which may be as simple as an offset or transposition cipher or a more complex technique such as a public key encryption technique. Such a technique can also be used to apply a digital signature to the code containing, for example, information about the particular battery tester being used.

Although the present invention has been described with reference to preferred embodiments, workers skilled in the art will recognize that changes may be made in form and detail without departing from the spirit and scope of the invention. For example, one may use other input mechanisms to obtain test condition information or employ other battery tests than those explicitly described. Further, the code may be generated using any appropriate technique.

What is claimed is:

1. A method of monitoring a condition of a storage battery, comprising:
    connecting a battery test device to the storage battery;
    obtaining test condition information related to the battery;
    obtaining raw battery test data by performing a step in a battery test on the storage battery with the battery test device;
    digitizing the raw test data with the battery test device;
    determining, using a microprocessor in the battery test device, the condition of the battery as a function of the digitized raw test data and the test condition information;
    providing a visual output indicative of the condition of the battery;
    digitally combining the test condition information, the digitized raw test data and the condition of the battery to form an audit code, the audit code having properties such that the digitized raw test data and the condition of the battery are subsequently recovered from the audit code and the battery test subsequently audited through comparing the raw test data to the condition of the battery to identify user falsification of the battery test; and
    outputting the audit code.

2. The method of claim 1 wherein the raw test data includes battery conductance.

3. The method of claim 1 wherein the test condition information includes temperature information.

4. The method of claim 1 wherein the test condition information includes rated battery Cold Cranking Amps (CCA).

5. The method of claim 1 wherein the test condition information is related to a vehicle which contains the battery.

6. The method of claim 1 wherein the test condition information includes information related to the battery.

7. The method of claim 1 wherein the raw test data includes battery voltage.

8. The method of claim 1 wherein the step of obtaining the raw battery test data includes applying an electrical load to the battery.

9. The method of claim 1 wherein the audit code comprises an alpha numeric code.

10. The method of claim 1 including the step of placing the audit code onto the battery following the step of outputting the audit code.

11. The method of claim 1 including subsequently auditing the battery test based upon the audit code.

12. The method of claim 11 wherein the step of subsequently auditing comprises:
    extracting the raw test data, the test condition information and the battery condition from the battery;
    calculating on the battery condition as a function of the extracted raw test data and the extracted test condition information; and
    comparing the extracted battery condition with the calculated battery condition.

13. An apparatus for performing a battery test on a storage battery to determine the condition of the storage battery, comprising:
    battery test circuitry obtaining raw test data for the battery;
    an analog to digital converter providing digitized raw test data;
    input circuitry adapted to receive test condition information related to a test condition of the storage battery;
    a microprocessor determining the battery condition of the storage battery as a function of the digitized raw test data and the test condition information, wherein the microprocessor includes calculation circuitry for providing an audit code which is a combination of the battery condition, the digitized raw test data, and the test condition information, the audit code having properties such that the battery condition, the digitized raw test data, and the test condition information is subsequently recovered from the audit code and the battery test subsequently audited through comparing the raw test data to the condition of the battery to identify user falsification of the battery test; and
    output circuitry outputting the final battery test result and separately outputting the audit code.

14. The apparatus of claim 13 wherein the battery test circuitry includes circuitry determining battery conductance.

15. The apparatus of claim 13 wherein the battery test circuitry includes circuitry applying an electrical load to the battery.

16. The apparatus of claim 13 wherein the raw test data comprises battery voltage.

17. The apparatus of claim 13 wherein test condition information includes information related to battery temperature.

18. The apparatus of claim 13 wherein test condition information includes information related to geographic location.

19. The apparatus of claim 13 wherein test condition information includes information related to a vehicle containing the battery.

20. The apparatus of claim 13 wherein test condition information includes information related to the battery.

21. The apparatus of claim 13 wherein the input circuitry includes a manual input for receiving an input from a user.

22. The apparatus of claim 20 wherein information related to the battery comprises rated battery Cold Cranking Amps (CCA).

23. The method of claim 1 wherein the test condition information comprises battery type.

24. The method of claim 1 wherein the test condition information comprises geographic location.

25. The method of claim 1 wherein the test condition information comprises time information.

26. The method of claim 1 wherein the test condition information comprises the name of the operator.

27. The method of claim 1 wherein the test condition information comprises the VIN code of a vehicle which contains the battery.

28. The method of claim 1 wherein the test condition information comprises battery specific information.

29. The method of claim 1 wherein the test condition information comprises battery serial number.

30. The method of claim 1 wherein the test condition information comprises battery model.

31. The method of claim 1 wherein the test condition information comprises date of manufacture of the battery.

32. The method of claim 1 wherein the test condition information comprises a digital signature.

33. The method of claim 1 wherein the step of outputting comprises printing an audit code.

34. The method of claim 1 wherein the step of printing the audit code comprises printing a label.

35. The method of claim 1 wherein the step of printing the audit code comprises printing a bar code.

36. The method of claim 1 wherein the step of outputting comprises transmitting the audit code data.

37. The method of claim 1 wherein the step of transmitting the audit code data comprises transmitting data through a modem.

38. The method of claim 1 wherein the step of determining the condition of the battery comprises determining battery capacity.

39. The method of claim 1 wherein the step of determining the condition of the battery comprises determining state of charge.

40. The method of claim 1 wherein the step of obtaining raw battery test data comprises performing a resistance test.

41. The method of claim 1 wherein the step of obtaining raw battery test data comprises an impedance test.

42. The apparatus of claim 20 wherein the information related to the battery comprises battery type.

43. The apparatus of claim 20 wherein the information related to the battery comprises battery serial number.

44. The apparatus of claim 20 wherein the information related to the battery comprises battery model.

45. The apparatus of claim 20 wherein the information related to the battery comprises date of the manufacture of the battery.

46. The apparatus of claim 19 wherein the information related to the vehicle comprises the vehicle VIN code.

47. The apparatus of claim 13 wherein the test condition information includes geographic location.

48. The apparatus of claim 13 wherein the test condition information includes time information.

49. The apparatus of claim 13 wherein the test condition information includes the name of the operator.

50. The apparatus of claim 13 wherein the test condition information includes a digital signature.

51. The apparatus of claim 13 wherein the output circuitry comprises a printer output.

52. The apparatus of claim 13 wherein the output circuitry comprises a data transmission circuit.

53. The apparatus of claim 5 wherein the data transmission circuit comprises a modem.

54. The apparatus of claim 13 wherein the battery test circuitry includes a circuitry determining battery impedance.

* * * * *